(12) United States Patent
Rutter, Jr. et al.

(10) Patent No.: US 6,749,765 B2
(45) Date of Patent: Jun. 15, 2004

(54) APERTURE FILL

(75) Inventors: Edward W. Rutter, Jr., Franklin, MA (US); Peter Trefonas, III, Medway, MA (US); Edward K. Pavelchek, Stow, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/108,070

(22) Filed: Mar. 27, 2002

(65) Prior Publication Data

US 2002/0110665 A1 Aug. 15, 2002

Related U.S. Application Data

(62) Division of application No. 09/556,542, filed on Apr. 24, 2000.
(51) Int. Cl.$^7$ .................................... H01L 21/00
(52) U.S. Cl. ........................ 216/67; 427/155; 528/88; 528/137
(58) Field of Search ..................... 216/67; 427/155; 528/88, 137

(56) References Cited

U.S. PATENT DOCUMENTS

| | | | |
|---|---|---|---|
| 4,557,797 A | 12/1985 | Fuller et al. |
| 5,514,247 A | 5/1996 | Shan et al. |
| 5,851,738 A | 12/1998 | Thackeray et al. |
| 5,976,703 A | 11/1999 | Nakata et al. |
| 6,027,853 A | 2/2000 | Malik et al. |

OTHER PUBLICATIONS

Adams et al., "Planarizing AR for DUV Lithography", *SPIE*, vol. 3678, Part of the SPIE Conference on Advances in Resist Technology and Processing XVI, Santa Clara, California, Mar. 1999, pp. 849–856.

*Primary Examiner*—Allan Olsen
(74) *Attorney, Agent, or Firm*—S. Matthew Cairns

(57) ABSTRACT

Disclosed are compositions and methods for providing substantially planarized surfaces in the manufacture of electronic devices. Also disclosed are compositions and methods for protecting apertures in the manufacture of electronic devices.

13 Claims, 5 Drawing Sheets

APERTURE FILL

This Application is a divisional of U.S. patent application Ser. No. 09/556,542, filed on Apr. 24, 2000.

BACKGROUND OF THE INVENTION

The present invention relates generally to the field of manufacture of electronic devices. In particular, the present invention relates to the planarization of a substrate used in the manufacture of electronic devices, and more particularly to the filling of apertures.

In the manufacture of electronic devices, such as printed wiring boards or semiconductors, a number of layers of material, such as photoresists or antireflective coatings, are applied to a substrate. It certain instances, it is desired that the applied layer be conformal, whereas in other instances it is desired that the applied layer be planarizing. In particular, difficulties can arise in the patterning of upper layers in an integrated circuit structure where the lower layers have substantial topography. One difficulty in such patterning is the vertical excursion which can be substantial. For example, vertical variations as much as a micron or two are possible. Such vertical variation makes it difficult to focus the optical pattern, since the vertical excursions may take portions of the surface out of the available depth of field. In such situations, it is advantageous to place the photoresist layer all at the same height, or planarized, to potentially enhance available depth of focus.

One method of placing a photoresist at the same height over a surface is disclosed in U.S. Pat. No. 4,557,797 (Fuller et al.) which uses a multi-layer structure having a relatively thick bottom layer of poly(methyl methacrylate) ("PMMA") to provide a planar surface, a thin middle layer of an antireflective coating and a thin top layer of a photoresist material. However, this system results in a thick polymer layer which must be removed. Such layers are typically removed by a variety of methods, such as chemical mechanical polishing ("CMP"), etching and wet chemical methods. Due to the added time and cost of such removal processes, it is desired that the polymer layers be as thin as possible to aid in their subsequent removal.

Certain antireflective coatings themselves may planarize the surface of a substrate sufficiently to allow effective use of a photoresist. For example, see Adams et al., *Planarizing AR for DUV Lithography, Microlithography* 1999: *Advances in Resist Technology and Processing XVI*, Proceedings of SPIE, vol. 3678, part 2, pp 849–856, 1999. However, such antireflective coatings are not disclosed to completely fill apertures, such as vias and trenches, and have relatively low etch resistance and moderate to low gap filling ability. Etch resistance is important in dual damascene processes where the bottoms of vias need to be protected during etching of the trenches. Current antireflective coatings are not sufficiently gap filling to completely fill the bottoms of small features, particularly sub-quarter-micron sized features, and may not be sufficiently resistant to such etch processes to protect the bottoms of vias during trench etching.

U.S. Pat. No. 5,976,703 (Nakata et al.) discloses a planarization layer for printed wiring board substrates. Such planarization layers use polysilphenylenesiloxane or copolymers of polysilphenylenesiloxane with an organosiloxane. These polymers are capable of planarizing features having geometries in the range of 10 to several hundred $\mu$m. Such polymers are not disclosed for use in semiconductor manufacture and are limited in their ability to withstand subsequent processing steps, such as in dual damascene manufacturing processes.

There is thus a continuing need to provide planarized surfaces and aperture filling material having sufficient etch resistance to protect the bottoms of features during subsequent processing steps.

SUMMARY OF THE INVENTION

It has been surprisingly found that the present invention provides substantial local planarization of surfaces with less overcoating, has better gap filling capabilities and better etch resistance than known compositions. It has also been surprisingly found that the present invention provides protection of features, particularly the bottoms of small apertures during subsequent processing steps. The present invention is thus particularly useful in the manufacture of semiconductors using dual damascene processes.

In one aspect the present invention provides a composition comprising one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, and wherein the hydroxyl group is at least about 3% wt of the cross-linkable polymers.

In a second aspect, the present invention provides a substrate having apertures wherein the apertures contain a composition including the composition described above.

In a third aspect, the present invention provides a method of protecting the bottom of apertures in the manufacture of an electronic device including the steps of disposing on a surface of a substrate having apertures the composition described above; and heating the substrate at a temperature sufficient to at least partially cure the composition.

In a fourth aspect, the present invention provides a substrate having apertures wherein the apertures comprise a composition comprising one or more cross-linked polymers comprising as polymerized units one or more cross-linkable polymers having a weight average molecular weight of less than or equal to about 8000 and a value of $M_w/M_n$ of at least 1.5 and one or more cross-linking agents, wherein the cross-linkable polymers comprise as polymerized units at least one hydroxyl group containing monomer, and wherein the hydroxyl group is at least about 3% wt of the cross-linkable polymers.

In a fifth aspect, the present invention provides a method of providing a substantially planarized surface including the steps of disposing on a surface of a substrate a composition comprising one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, and wherein the hydroxyl group is at least about 3% wt of the cross-linkable polymers; and at least partially curing the composition by heating the substrate at a temperature sufficient to at least partially cure the composition.

In a sixth aspect, the present invention provides a method for manufacturing an electronic device including the steps of: a) providing two or more first apertures in a substrate; b) at least partially filling the two or more first apertures with an aperture fill composition including one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers comprise as polymerized units at least one hydroxyl group containing monomer, and wherein the hydroxyl group is at least about 3% wt of the cross-linkable polymers; c) heating the substrate at a temperature sufficient to at least partially cure the composition; d) plasma etching a feature connecting two or more at least partially filled first apertures; and e) removing the at least partially cured composition from the two or more first apertures.

In a seventh aspect, the present invention provides a method of protecting the bottom of apertures in the manufacture of an electronic device including the steps of disposing on a surface of a substrate having apertures in a layer an aperture fill composition including one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, wherein the hydroxyl group is at least about 3% wt of the cross-linkable polymers, wherein at least one of the cross-linkable polymer and the cross-linking agent include as polymerized units an aromatic monomer, and wherein at least one of the cross-linkable polymer and the cross-linking agent include as polymerized units an aliphatic monomer; and heating the substrate at a temperature sufficient to at least partially cure the composition; wherein the plasma etch rate of the aperture fill composition and the plasma etch rate of the aperture containing layer are substantially matched.

In an eighth aspect, the present invention provides a substrate having one or more apertures in a layer wherein the one or more apertures contain an aperture filling composition including cross-linked polymer, wherein the plasma etch rate of the crosslinked polymer and the plasma etch rate of the aperture containing layer are substantially matched.

DETAILED DESCRIPTION OF THE INVENTION

Figure 1:
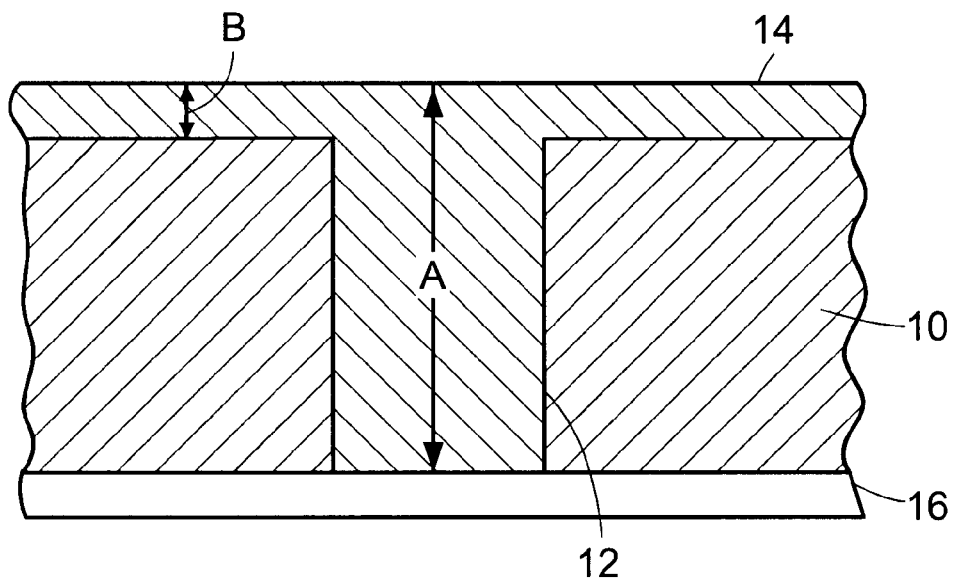
FIG. 1 shows a cross-sectional representation of a completely filled via with some overcoating.

As used throughout this specification, the following abbreviations shall have the following meanings, unless the context clearly indicates otherwise: ° C.=degrees Centigrade; g=gram; cm=centimeter; nm=nanometer; Å=angstrom; % wt=percent by weight; L=liter; mL=milliliter; and rpm=revolutions per minute. The term "polymer" refers to dimers, trimers, tetramers, oligomers, homopolymers, copolymers and the like. The term "(meth) acrylic" includes both acrylic and methacrylic and the term "(meth)acrylate" includes both acrylate and methacrylate. Likewise, the term "(meth)acrylamide" refers to both acrylamide and methacrylamide. "Alkyl" includes straight chain, branched and cyclic alkyl groups. "Cross-linker" and "cross-linking agent" are used interchangeably throughout this specification. The term "monomer" refers to an ethylenically or acetylenically unsaturated compound capable of being polymerized. "Apertures" refer to vias, trenches, and combinations thereof. "Features" refer to various geometries, including apertures.

All amounts are percent by weight and all ratios are by weight, unless otherwise noted. All numerical ranges are inclusive and combinable.

The present invention is directed to providing a substrate with a substantially locally planar surface. The present invention is further directed to providing a substrate with apertures protected from subsequent etching steps. For substrates having features, the present invention provides a substantially planar surface over all the features as well as substantially filled apertures. The present invention is particularly suited for the filling of apertures, such as vias, in dual damascene processes in semiconductor manufacture.

The compositions of the present invention useful as planarizing and aperture filling, particularly via filling, compositions include one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers comprise as polymerized units at least one hydroxyl group containing monomer, and wherein the hydroxyl group is at least about 3% wt of the cross-linkable polymers. It is preferred that the cross-linkable polymers have a weight average molecular weight of about 5000 or less, more preferably about 3000 or less. It is also preferred that the cross-linkable polymers have a weight average molecular weight of at least about 300, preferably at least about 400, and more preferably at least about 500. Thus, a particularly useful weight average molecular weight range is from about 300 to about 5000.

The cross-linkable polymers of the present invention have low molecular weights and broad molecular weight distributions. The molecular weight distributions of the present invention are characterized by the polydispersity of the polymers, i.e. the ratio of the weight average molecular weight to number average molecular weight ("$M_w/M_n$"). the polymers of the present invention typically have a value of $M_w/M_n$ i.e. polydispersity, of at least 1.5, preferably at least 1.8, more preferably at least 2.0, still more preferably at least 2.5, even more preferably at least 3.0 and most preferably at least 3.5. Typical polydispersities of such cross-linkable polymers are in the range of from 1.5 to 4, preferably 1.8 to 4, and more preferably 2 to 4.

The polymers of the present invention include as polymerized one or more hydroxyl group containing monomer. Such monomers may be aliphatic or aromatic and may contain other functionality. It will be appreciated that such hydroxyl group containing monomers may contain one, two, three, four or more hydroxyl groups. The hydroxyl group comprises at least about 3% wt of the cross-linkable polymers, preferably at least about 5% wt, and more preferably at least about 8% wt. Particularly useful cross-linkable polymers include those comprising from about 3 to about 25% wt of hydroxyl groups.

Suitable cross-linkable polymers include, but are not limited to, aromatic-aldehyde condensates and any polymers including as polymerized units one or more hydroxyl group containing monomers. The aromatic-aldehyde condensates useful in the present invention include, but are not limited to, phenolic novolak resins. Such novolak resins are typically prepared by condensation of a phenol with an aldehyde and are well known in the art and described in numerous publications including the Kirk Othmer Encyclopedia of Chemical Technology, Volume 15, pages 176 to 208, 1968, incorporated herein by reference to the extent it teaches such resins. Although phenol itself is the commonly used phenol for the formation of such phenolic resins, other hydroxy-substituted aromatic compounds are equally suitable, such as but not limited to resorcinol, gallic acid, alkyl substituted phenols such as naphthols, cresols, xylenols, and p-tert-butylphenol, and bisphenols such as p-phenylphenol and 4,4'-isopropylidenediphenol. Preferred phenols include the cresols, and more preferably m-cresol, mixtures of m- and p-cresol, 2,5-xylenol and mixtures thereof. Mixtures of hydroxy-substituted aromatic compounds may be advantageously used in the present invention.

The aldehyde used is typically formaldehyde, but other aldehydes such as but not limited to acetaldehyde, furfuraldehyde and aromatic aldehydes may be used. Preferred aromatic aldehydes are those where a hydroxyl group is in a position ortho to the carbonyl group. Most preferred aromatic aldehydes are salicylaldehyde, benzaldehyde and mixtures thereof. Other aromatic aldehydes suitable for purposes of the invention include 2-chlorobenzaldehyde, 3-hydroxybenzaldehyde, 4-hydroxybenzaldehyde, 2-methoxybenzaldehyde, 3-nitrobenzaldehyde, and the like. Mixtures of aldehydes may be advantageously used in the present invention. When an aromatic aldehyde is mixed with formaldehyde or a formaldehyde precursor such as paraformaldehyde, the aromatic aldehyde preferably is in molar excess of formaldehyde, and more preferably at least 90% by weight of the aldehyde mixture.

Typically, the phenol novolak resins are formed by condensing the phenol, i.e. hydroxy-substituted aromatic compound, with the aldehyde in the presence of acid. The molar concentration of the aldehyde may be slightly less than that of the phenol, but may also be equivalent to or slightly in excess of the phenol without formation of a crosslinked resin. In this respect, the ratio of the phenol to the aldehyde may vary between about 1.1 to 1.0 and 1.0 to 1.1 See, for example, U.S. Pat. No. 5,939,511 (Zampini et al.).

In general, the polydispersity of such aromatic-aldehyde condensates useful as cross-linkable polymers in the present invention is at least about 2.5, preferably at least about 3.0 and more preferably at least about 3.5.

Any hydroxyl group containing ethylenically or acetylenically unsaturated compound is useful as the hydroxyl group containing monomer in the present invention. Such hydroxy group containing monomers may be aliphatic or aromatic. Suitable hydroxy group containing monomers include, but are not limited to, phenol, cresol, resorcinol, pyrogallol, methylol phenol, methylol cresol, methylol resorcinol, methylol pyrogallol, hydroxyethylphenol, hydroxypropylphenol, hydroxyethylcresol, vinyl phenol, vinyl cresol, vinyl methoxy phenol, hydroxyethyl (meth) acrylate, 2-hydroxypropyl (meth)acrylate, 3-hydroxypropyl (meth)acrylate, hydroxycyclohexyl (meth)acrylate, hydroxyphenyl (meth)acrylate, di-ethyleneglycol (meth)acrylate, bis(hydroxyethyl) itaconate, bis(hydroxyethyl) citraconate, bis(hydroxyethyl) fumarate, hydroxyethyl itaconate, aaly phenol, allyl methoxy phenol, allyl alcohol, vinyl alcohol, and the like.

Suitable monomers useful in combination with hydroxyl group containing monomers of the present invention include, but are not limited to, (meth)acrylic acid, (meth) acrylamides, alkyl (meth)acrylates, alkenyl (meth)acrylates, aromatic (meth)acrylates, vinyl aromatic monomers, nitrogen-containing compounds and their thio-analogs, substituted ethylene monomers, and the like.

Typically, the alkyl (meth)acrylates useful in the present invention are ($C_1$–$C_{24}$) alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof Particularly useful mixtures of high cut alkyl (meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy ($C_2$–$C_6$)alkyl (meth)acrylates, dialkylamino ($C_2$–$C_6$)-alkyl (meth)acrylates, dialkylamino($C_2$–$C_6$)alkyl (meth)acrylamides.

Particularly useful substituted alkyl (meth)acrylate monomers are those with one or more hydroxyl groups in the alkyl radical, especially those where the hydroxyl group is found at the β-position (2-position) in the alkyl radical. Hydroxyalkyl (meth)acrylate monomers in which the substituted alkyl group is a ($C_2$–$C_6$)alkyl, branched or unbranched, are preferred. Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl (meth)acrylate monomers are HEMA, 1-methyl-2-hydroxyethyl methacrylate, 2-hydroxypropyl methacrylate and mixtures thereof A mixture of the latter two monomers is commonly referred to as "hydroxypropyl methacrylate" or "HPMA."

Other substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri($C_1$–$C_6$)alkoxysilyl (meth)acrylate, γ-propyl tri($C_1$–$C_6$)alkylsilyl (meth)acrylate, y-propyl di($C_1$–$C_6$)alkoxy ($C_1$–$C_6$)alkylsilyl (meth)acrylate, γ-propyl di($C_1$–$C_6$)alkyl ($C_1$–$C_6$)alkoxysilyl (meth)acrylate, vinyl tri($C_1$–$C_6$) alkoxysilyl (meth)acrylate, vinyl di($C_1$–$C_6$)alkoxy($C_1$–$C_6$) alkylsilyl (meth)acrylate, vinyl ($C_1$–$C_6$)alkoxy($C_1$–$C_6$) alkylsilyl (meth)acrylate, vinyl tri($C_1$–$C_6$)alkylsilyl (meth) acrylate, and mixtures thereof.

The vinylaromatic monomers useful as unsaturated monomers in the present invention include, but are not limited to: styrene ("STY"), α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$–$C_{10}$)alkoxy, halo($C_1$–$C_{10}$) alkyl, carb($C_1$–$C_{10}$)alkoxy, carboxy, amino, ($C_1$–$C_{10}$) alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl ($C_1$–$C_8$) substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinylpyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: allylic monomers, vinyl acetate, vinyl formamide, vinyl chloride, vinyl fluoride, vinyl bromide, vinylidene chloride, vinylidene fluoride and vinylidene bromide.

It is preferred that the cross-linkable polymers of the present invention include as polymerized units one or more aromatic compounds, such as at least about 3% wt, preferably at least about 5% wt, and more preferably at least about 10% wt. Particularly useful cross-linkable polymers include those containing at least about 20% wt of the total polymerized units. It is more preferred that the cross-linkable polymers include one or more aromatic-aldehyde condensates. Particularly useful cross-linkable polymers include one or more aromatic-aldehyde condensates and one or more other polymers, such as (meth)acrylate polymers, wherein the value of $M_w/M_n$ for the aromatic-aldehyde condensates is at least 2.5, and preferably at least 3.0. It is still further preferred that the cross-linkable polymers of the present invention are substantially free of silphenylene moieties, and more preferably free of silphenylene moieties.

Cross-linkable polymers are typically present in the compositions of the invention in amounts of from about 60 to about 85% of solids, and preferably from about 70 to about 85% of solids.

Cross-linkers useful in the present invention are any which undergo acid catalyzed cross-linking with the cross-linkable polymers. Suitable cross-linkers include di-, tri-, tetra-, or higher multi-functional ethylenically unsaturated monomers. Examples of cross-linkers useful in the present invention include, but are not limited to: trivinylbenzene, divinyltoluene; divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly (phenyl vinyl siloxane), tetra($C_1$–$C_8$)alkoxyglycoluril such as tetramethoxyglycoluril and tetrabutoxyglycoluril, and mixtures thereof.

The cross-linkers of the present invention are typically used in amounts of from about 5 to about 25% of solids, and preferably from about 10 to about 22% of solids.

The acid catalysts useful in the present invention include free acids and acid generators. Any free acid which is compatible with the compositions of the present invention and catalyzes cross-linking of the polymer and cross-linking agent is suitable for use in the present invention. Examples of free acids include, but are not limited to, sulfonic acids such as methane sulfonic acid, ethane sulfonic acid, propyl sulfonic acid, phenyl sulfonic acid, toluene sulfonic acid, dodecylbenzene sulfonic acid, and trifluoromethyl sulfonic acid.

The acid generators include thermal acid generators ("TAGs"), photoacid generators ("PAGs") and mixtures thereof. Any thermal acid generator and any photoacid generator are useful in the present invention. A thermal acid generator is any compound that liberates acid upon thermal treatment. Suitable thermal acid generators include, but are not limited to, 2,4,4,6-tetrabromocyclohexadienone, benzoin tosylate, 2-nitrobenzyl tosylate, other alkyl esters of organic sulfonic acids and amine salts of sulfonic acids. Compounds that generate a sulfonic acid upon activation are generally suitable. Photoacid generators are compounds that liberate acid upon photolysis. Suitable photoacid generators include, but are not limited to, onium salts, halogenated non-ionic photoacid generators such as 1,1-bis(p-chlorophenyl)-2,2,2-trichloroethane, and other photoacid generators disclosed herein for use in photoresist compositions.

The acid catalysts are typically present in the compositions of the present invention in an amount of from about 0.1 to about 8% of solids, and preferably from about 0.5 to about 5% of solids. It is preferred that a combination of acid catalysts is used in the present invention. Suitable combinations include a free acid with a photoacid generator and a free acid with a thermal acid generator. Such acid catalysts are generally known or commercially available and may be used without further purification.

The compositions of the present invention contain one or more solvents. Any solvent that is compatible with the formulation is suitable. Solvents having low viscosity are preferred. Suitable solvents include, but are not limited to, propylene glycol methyl ether acetate, 2-heptanone, ethyl lactate or one or more of the glycol ethers such as 2-methoxyethyl ether (diglyme), ethylene glycol monomethyl ether, and propylene glycol monomethyl ether; solvents that have both ether and hydroxy moieties such as methoxy butanol, ethoxy butanol, methoxy propanol and ethoxy propanol; esters such as methyl cellosolve acetate, ethyl cellosolve acetate, propylene glycol monomethyl ether acetate, dipropylene glycol monomethyl ether acetate and other solvents such as dibasic esters, propylene carbonate and gamma-butyrolactone. Particularly suitable solvents useful in the present invention are relatively high boiling, i.e. such solvents have boiling points at least about 170° C., and preferably at least about 190° C. Mixtures of solvents may be advantageously used in the present invention. Thus, the solvents of the present invention may be admixed with one or more other solvents. Such other solvents may be high boiling or low boiling.

The compositions of the present invention may optionally include one or more other components, such as, but not limited to, plasticizers, surfactants, leveling agents, dyes, pigments, chromophores, and the like.

Plasticizers may be added to the compositions of the present invention to improve certain characteristics of the compositions. Suitable plasticizers include, but are not limited to, dibasic esters such as dimethyl adipate and dimethyl succinate. Mixtures of plasticizers may be used in the present invention. Typically, the plasticizers are used in an amount of from about 0.5 to about 10% of solids, and preferably from about 1 to about 5% of solids. It is preferred that one or more plasticizers are used in the compositions of the present invention. It will be appreciated by those skilled in the art that higher amounts of plasticizers, such as up to about 50 to about 100% of solids, may be advantageously used in the present invention.

The leveling agents useful in the present invention are surface leveling agents such as those available under the tradename Silwet 7604 from Union Carbide, or the surfactant FC 430 available from the 3M Company. The choice and amount of such leveling agent is within the ability of one skilled in the art.

The compositions of the present invention may also function as antireflective coatings. For example, when the cross-linkable polymer and/or the cross-linking agent contains aromatic groups, such compositions may be used as an antireflective composition for 193 nm radiation. In the alternative, dyes or chromophores may be added to the compositions of the present invention, such as by copolymerization or admixture with, to provide antireflective compositions useful at other wavelengths of radiation.

The concentration of the dry components, i.e. one or more cross-linkable polymers, one or more acid catalysts and one or more cross-linking agents, in the solvent will depend on several factors such as the method of application. In general, the solids content of the compositions of the present invention include from about 0.5 to 25 weight percent of the total weight of the composition, preferably the solids content varies from about 2 to 20 weight percent of the total weight of the composition. The compositions of the present invention are prepared by combining the components in any order.

Particularly suitable compositions of the present invention include those wherein the cross-linkable polymer is an aromatic-aldehyde condensate, the acid catalyst is blocked dodecyl benzene sulfonic acid, the cross-linking agent selected from tetramethoxyglycoluril or tetrabutoxyglycoluril and preferably tetrabutoxyglycoluril, and the solvent is propylene glycol monomethyl ether acetate.

The compositions of the present invention are useful in substantially planarizing the surface of substrates, such as electronic devices. Particularly useful substrates include, but are not limited to, printed wiring boards, conductors and semiconductor devices such as wafers used in the manufacture of semiconductors. The compositions of the present invention may be applied to the substrate to be planarized by any of a variety of means, such as by spin coating. When applied to a substrate, the compositions of the present invention provide a coating or layer disposed on the surface of the substrate. When the compositions are applied by spin coating, such as to a semiconductor wafer, the thickness of the resulting film can be controlled, such as from about <200 Å to about 1.5 µm.

The present invention provides a method of providing a substantially locally planarized surface on a substrate including the steps of disposing on a surface of a substrate a composition including one or more cross-linkable polymers having a molecular weight of less than or equal to about 8000 and a value of $M_w/M_n$ of at least 1.5, one or more acid catalysts, one or more cross-linking agents and one or more solvents, wherein the cross-linkable polymers include as monomer units at least one hydroxyl group containing monomer, and wherein the hydroxyl group is at least about 3% wt of the cross-linkable polymers; and at least partially curing the composition by heating the substrate at a temperature sufficient to at least partially cure the composition.

Figure 2:
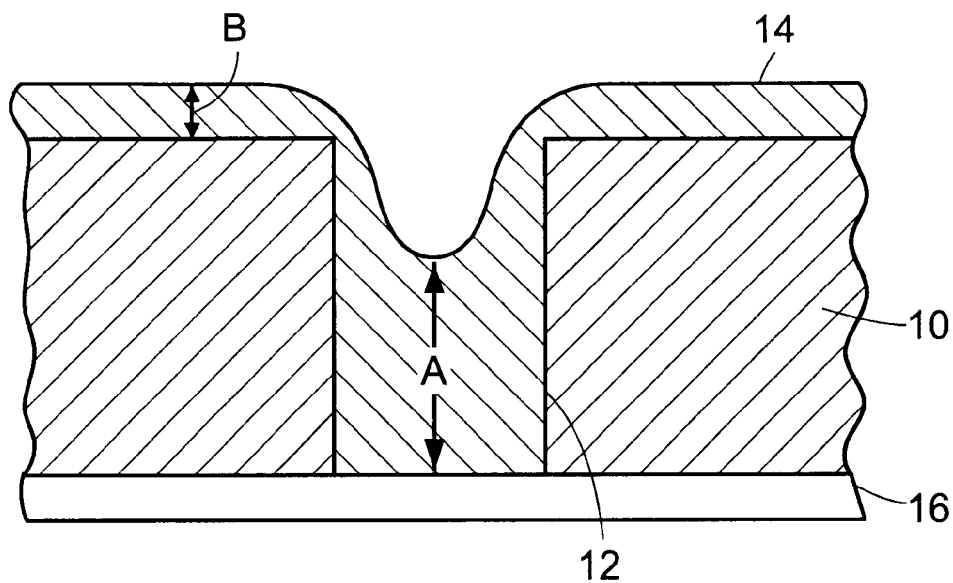
FIG. 2 shows a cross-sectional representation of a partially filled via.

FIG. 1 shows a cross-sectional representation of a via 12 in an aperture containing layer 10 disposed on substrate 16 where the via is completely filled by a composition of the present invention 14, forming a substantially planarized surface overcoating the aperture containing layer 10. Substantially planarized substrates refers to substrates having substantially filled apertures. "Substantially filled" apertures have an aperture fill ratio ("AFR") of about 2 to about 100. AFR is defined for an aperture having an aspect ratio >2, and preferably having a size of ≦0.5 µm, by the formula A/B, where A is the height of the aperture fill composition in the aperture and B is the thickness of the aperture fill composition film or layer on the surface of the aperture containing layer. This relationship is further shown in FIG. 2 which shows a cross-sectional representation of via 12 in an aperture containing layer 10 disposed on substrate 16 where the via is substantially filled by a composition of the present invention 14. Such AFR may be determined for completely filled apertures, as shown in FIG. 1, or partially filled apertures, as shown in FIG. 2.

Typically, the compositions of the present invention are at least partially cured by heated at a temperature of from about 75° to about 250° C., preferably from about 90° to about 225°C. "At least partially cured" refers to at least 10% cross-linking of the aperture fill composition. It is preferred that the aperture fill composition is substantially cross-linked and more preferably fully crosslinked. The compositions of the present invention may be cured by subjecting a substrate coated with the composition to a one-step or two-step bake. A one-step bake heats the compositions of the present invention at a temperature and for a period of time sufficiently to at least partially, and preferably substantially, cross-link the composition. In the alternative, a two-step bake may be used which heats the compositions of the present invention at a first temperature which is not sufficient to cure the compositions but allows the compositions to reflow to improve planarization, followed by heating at a second temperature and for a period of time sufficiently to at least partially, and preferably substantially, cross-link the composition. When a two-step bake is used, the substrate containing a composition of the present invention is heated at a temperature and for a period of time such that the AFR increases by at least 10%, preferably at least 15%, and more preferably at least 25%.

Thus, the present invention also provides a substantially locally planarized surface on a substrate including the steps of disposing on a substrate a composition including one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, and wherein the hydroxyl group is at least about 3% wt of the cross-linkable polymers; heating the substrate at a first temperature sufficient to reflow the composition; and then heating the substrate at a second temperature sufficient to cure the composition. It is preferred that the substrate includes one or more apertures.

Such processes produce substrates having substantially planarized surfaces having a cross-linked polymer film, coating or layer wherein the film includes as polymerized units one or more cross-linkable polymers and one or more cross-linking agents, wherein the cross-linkable polymers have a weight average molecular weight of less than or equal to about 8000 and a value of $M_w/M_n$ of at least 1.5, wherein the cross-linkable polymers include as polymerized units at least one hydroxyl group containing monomer, and wherein the hydroxyl group is at least about 3% wt of the cross-linkable polymers.

The present invention is particularly useful in protecting vias in dual damascene processes in semiconductor manufacture, while also providing a substantially locally planarized surface. Thus the present invention provides a substrate having apertures wherein the apertures contain a composition including a cross-linked polymer wherein the cross-linked polymer includes as polymerized units one or more cross-linkable polymers and one or more cross-linking agents, wherein the cross-linkable polymers have a weight average molecular weight of less than or equal to about 8000 and a value of $M_w/M_n$ of at least 1.5, wherein the cross-linkable polymers include as polymerized units at least one hydroxyl group containing monomer, and wherein the hydroxyl group is at least about 3% wt of the cross-linkable polymers.

In dual damascene processes, apertures, such as vias, are first formed in a substrate such as in a dielectric layer, optionally an antireflective coating is applied, a photoresist layer is then applied, trenches are patterned, the resist is exposed and developed, and the trenches are etched. In such process, the bottoms of the apertures may be compromised unless protected. The present invention provides a method of protecting the bottom of apertures in the manufacture of an electronic device including the steps of disposing on a surface of a substrate an aperture fill composition including one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, and wherein the hydroxyl group is at least about 3% wt of the cross-linkable polymers; and heating the substrate at a temperature sufficient to cure the composition.

Dual damascene process are important in the manufacture of semiconductor devices. Thus, the present invention provides a method for manufacturing an electronic device including the steps of: a) providing two or more first apertures in a substrate; b) at least partially filling the one or more first apertures with an aperture fill composition including one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, and wherein the hydroxyl group is at least about 3% wt of the cross-linkable polymers; c) heating the substrate to at least partially cure the composition; d) plasma etching a second aperture connecting two or more at least partially filled first apertures; and e) removing the at least partially cured the composition from the two or more first apertures. In such dual damascene processes, it is preferred that the process further include the step of disposing an antireflective coating on the surface of the aperture fill composition, and more preferably disposing a photoresist on the surface of the antireflective coating. The photoresist is then exposed using actinic radiation prior to etching. It is further preferred, in such processes that the plasma etch rates of the aperture fill composition and the substrate are substantially matched.

Figure 3:
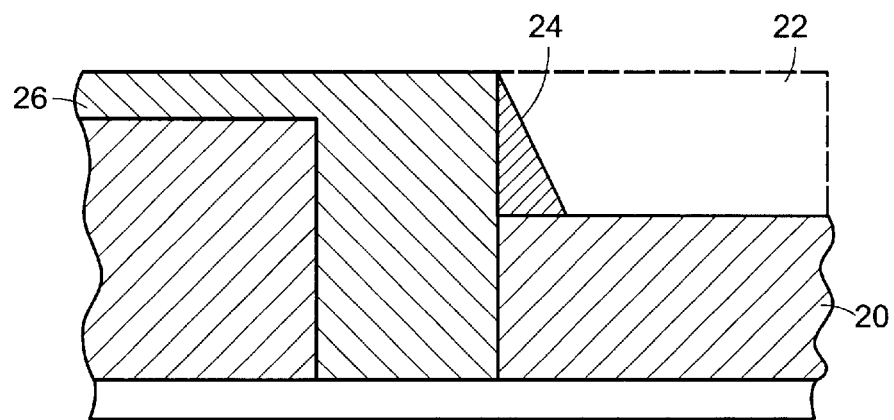
FIG. 3 shows a cross-sectional representation of trench formation in a dual damascene process.
Figure 4:
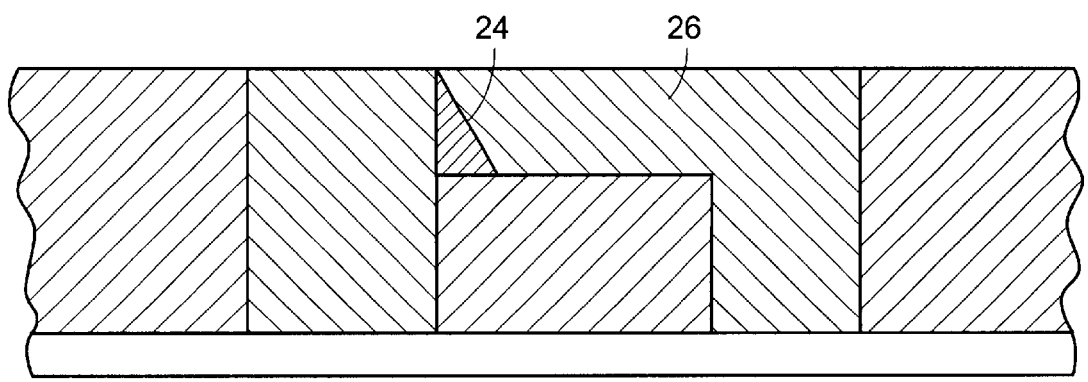
FIG. 4 shows a cross-sectional representation of a metallized trench.

If the aperture fill material of the present invention is too plasma etch resistant, i.e. etches more slowly than the aperture containing material, such as a dielectric layer, a problem develops during trench etching. With reference to FIG. 3, in such cases, as the aperture containing material 20 is etched to form the trench 22, a difficult to remove "fence" or organometallic polymer residue 24 forms adjacent to the aperture fill material 26. Such fences 24 may remain after metallization with copper 26 of the dual damascene structure, as can be seen in FIG. 4.

By substantially matching the plasma etch rate of the aperture fill material to that of the aperture containing layer of a substrate, the formation of such fences can be reduced or eliminated. The plasma etch rate of the aperture fill composition of the present invention can be adjusted by adjusting the ratio of the aromatic to nonaromatic moieties in the composition. For example, by decreasing the content of the aromatic moieties in the material, the plasma etch rate of the material is increased. Thus, for applications requiring a higher plasma etch rate of the aperture fill material, it is preferred that the content of the aromatic moieties in the composition by decreased, such as by decreasing the amount of aromatic moieties in the cross-linkable polymer or cross-linking agent. Such decrease in aromatic compound content can be readily achieved by substituting aliphatic compounds for the aromatic compounds. Thus, by replacing an amount of aromatic monomer with an aliphatic monomer, the plasma etch rate of the composition is increased. For example, in semiconductor manufacture using dual damascene processes, it is preferred that the plasma etch rate of the aperture fill composition be substantially matched to the plasma etch rate of the aperture containing layer, such as a dielectric layer. By "substantially matched plasma etch rates" is meant that the plasma etch rate of the aperture containing material is about one to two times more etch resistant than the plasma etch rate of the aperture fill composition. It is preferred that the plasma etch rate of the aperture fill composition of the present invention is 1 to 2 times the plasma etch rate of the aperture containing material. In substantially matching the plasma etch rates of the aperture fill composition and the aperture containing layer, it is preferred that the cross-linkable polymer in the aperture fill composition have low aromatic moiety content, such as less than about 10% wt, preferably less than about 5% wt, and more preferably substantially free of aromatic moiety content.

Thus, the present invention provides a method of protecting the bottom of apertures in the manufacture of an electronic device including the steps of disposing on a surface of a substrate having apertures in a layer an aperture fill composition comprising one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers include as polymerized units at least one hydroxyl group containing monomer, wherein the hydroxyl group is at least about 3% wt of the cross-linkable polymers, wherein at least one of the cross-linkable polymer and the cross-linking agent include as polymerized units an aromatic monomer, and wherein at least one of the cross-linkable polymer and the cross-linking agent include as polymerized units an aliphatic monomer; and heating the substrate at a temperature sufficient to at least partially cure the composition; wherein the plasma etch rate of the aperture fill composition and the plasma etch rate of the aperture containing layer are substantially matched.

Also provided according to the present invention is a substrate having one or more apertures in a layer wherein the one or more apertures contain an aperture filling composition comprising cross-linked polymer, wherein the etch rate of the cross-linked polymer and the etch rate of the aperture containing layer are substantially matched.

Although the invention has been described with respect to semiconductor manufacture, it will be appreciated that the present invention may be used in a wide variety of applications. It will also be appreciated that the present invention is also useful in the global planarization of substrates.

The following examples are intended to illustrate further various aspects of the present invention, but are not intended to limit the scope of the invention in any aspect.

EXAMPLE 1

An aperture fill formulation was prepared by combining a meta-cresol-para-cresol-2,5-dimethoxyphenol novolak polymer (21.118 g of a 30% solids propylene glycol monomethyl ether acetate ("PGMEA") solution, Mn 800, Mw 2500 g/mol, Tg 83° C.), para-toulene sulfonic acid monohydrate (1.125 g of a 5.02% solution in PGMEA, 0.5% wt of solids), tetramethoxyglycoluril as cross-linking agent (0.748 g, 15% of solids), FC430 (available from 3M) as a surface active leveling agent (0.377 g (1% in PGMEA), 0.05% of solids), dimethyl adipate (0.323 g (5% of total solids but not included in solids calculation) and 26.32 g PGMEA (26.321 g). This prepared a 50 g sample at 15% solids. The formulation was rolled for a period sufficient to solubilize the material and filtered through a 0.2 micron poly(tetrafluoroethylene) ("PTFE") filter prior to use.

This solution was designed to produce a nominal 3000 Å film thickness at 3000 rpm after baking. The solution was dispensed by hand on a wafer patterned with vias of varying size and which were approximately 1 μm deep. The wafer was then spun at 3000 rpm followed by heating first at 90°C. for 60 seconds and then at 205°C. for 60 seconds.

Figure 5:
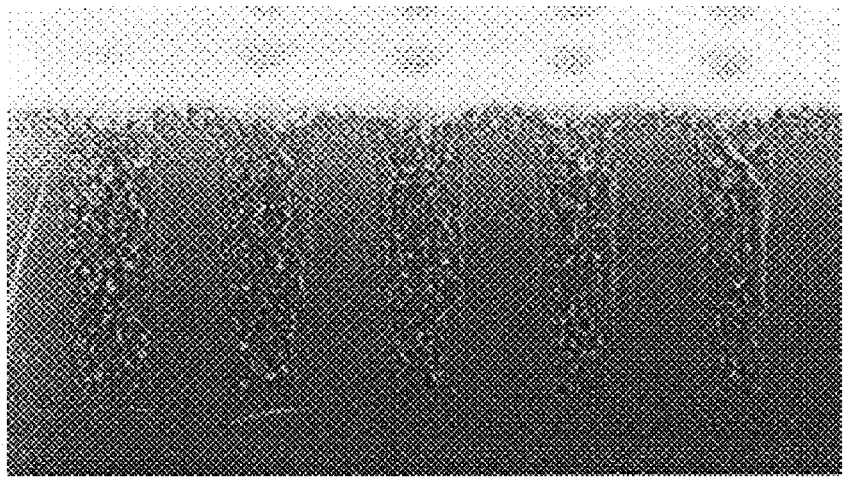
FIG. 5 shows a SEM of a via having a pitch of 1:1 filled with a composition of the invention.
Figure 6:
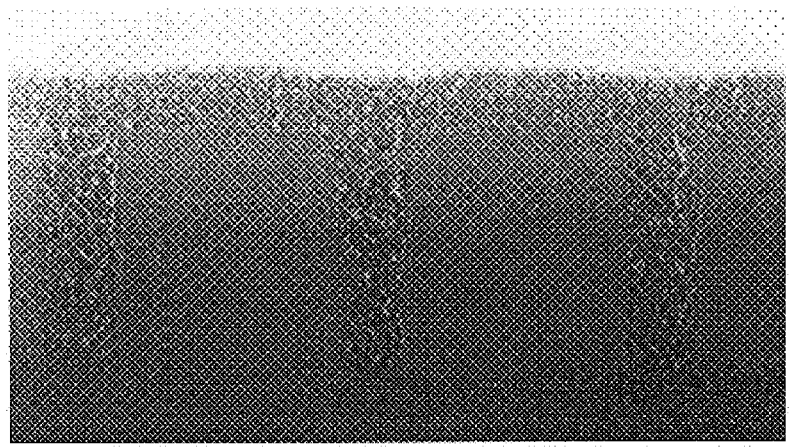
FIG. 6 shows a SEM of a via having a pitch of 1:3 filled with a composition of the invention.
Figure 7:
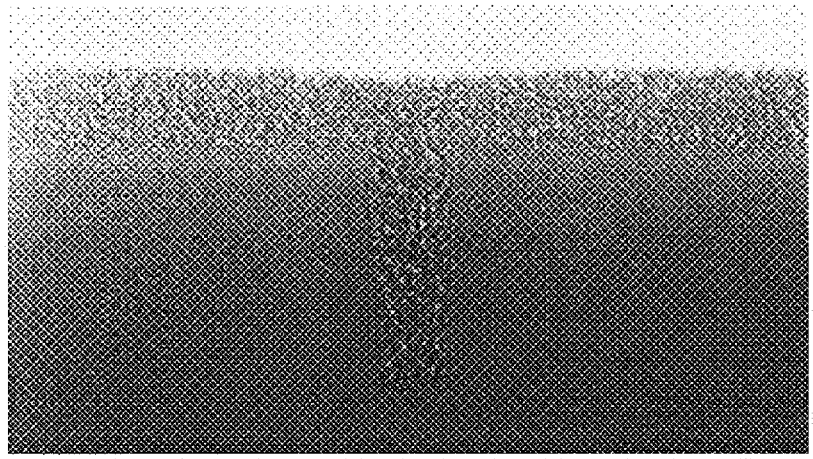
FIG. 7 shows a SEM of a via having a pitch of 1:6 filled with a composition of the invention.

Vias having the same size, 250 nm, but in areas of differing densities or pitches, were isolated and evaluated by scanning electron microscopy ("SEM"). FIG. 5 is a SEM of filled vias having a pitch of 1:1. FIG. 6 is a SEM of filled vias having a pitch of 1:3. FIG. 7 is a filled via (isolated) having a pitch of 1:6. These data show that the formulation had excellent gap fill properties and completely filled the vias with some extent of overfill, i.e. overcoat, for the features evaluated.

EXAMPLE 2

The procedure of Example 1 was repeated except that the para-toluene sulfonic acid was replaced with 0.479 g of a blocked dodecyl benzene sulfonic acid as a thermal acid generator, (Nacure 5225 available from King Industries, Norwalk, Conn.) as a 25% solids solution in iso-propanol, and the weights of the other components varied. The resultant formulation thus contained: meta-cresol-para-cresol-2,5-dimethoxyphenol novolak polymer (33.581 g of a 30% solids solution in PGMEA), a blocked dodecyl benzene sulfonic acid (0.479 g of a 25% solids solution in iso-propanol, 1% of solids), tetramethoxyglycoluril (15% of solids, 1.800 g), FC430 as a leveling agent (0.603 g of a 1% solution in PGMEA, 0.05% solids), dimethyl adipate (0.528 g, 5% of solids without including it in solids calculation) and the remainder as PGMEA.

EXAMPLE 3

The procedure of Example 2 was repeated except that the tetramethoxyglycoluril cross-linker was replaced with tetrabutoxyglycoluril. The formulation thus contained: meta-cresol-para-cresol-2,5-dimethoxyphenol novolak polymer (301.268 g of a 30% solids solution in PGMEA, 75.95% of solids), a blocked dodecyl benzene sulfonic acid (9.520 g of a 25% solids solution in iso-propanol, 2% of solids), tetrabutoxyglycoluril (26.180 g, 22% of solids), FC430 (5.950 g of a 1% solution in PGMEA, 0.05% solids), dimethyl adipate (5.950 g, 5% of solids without including it in solids calculation), and 322.512 g of PGMEA. This prepared a 700 g sample at 17% solids.

The sample was diluted to less than 10% solids and spin coated on a wafer (3000 rpm) containing 1 μm deep vias. The wafer was then heated at 205° C. for 60 seconds. Due to the lower solids content, vias in areas of dense features were partially filled, whereas isolated vias substantially filled.

What is claimed is:

1. A method for manufacturing an electronic device comprising the steps of: a) providing two or more apertures in a substrate; b) at least partially filling the two or more apertures with an aperture fill composition comprising one or more cross-linkable polymers having a weight average molecular weight of less than or equal to about 8000 and a value of $M_w/M_n$ of at least 1.5, one or more acid catalysts, one or more cross-linking agents and one or more solvents, wherein the cross-linkable polymers comprise as polymerized units at least one hydroxyl group containing monomer, and wherein the hydroxyl group is at least about 3% wt of the cross-linkable polymers; and c) heating the substrate at a temperature sufficient to at least partially cure the composition.

2. The method of claim 1 further comprising the step of disposing an antireflective coating on the surface of the aperture fill composition.

3. The method of claim 1 wherein an etch rate of the aperture fill composition and an etch rate of the substrate are substantially matched.

4. The method of claim 1 wherein at least one of the cross-linkable polymers and the cross-linking agent comprise as polymerized units an aromatic monomer, and wherein at least one of the cross-linkable polymers and the cross-linking agent comprise as polymerized units an aliphatic monomer; and wherein a plasma etch rate of the aperture fill composition and a plasma etch rate of the substrate are substantially matched.

5. The method of claim 1 further comprising the steps of plasma etching a feature connecting the two or more at least partially filled apertures; and removing the at least partially cured composition.

6. The method of claim 1 further comprising heating the substrate at a temperature sufficient to reflow the composition prior to the step of at least partially curing the composition.

7. The method of claim 1 wherein the solvent has a boiling point of greater than or equal to 170° C.

8. The method of claim 1 wherein the value of $M_w/M_n$ is at least 2.0.

9. The method of claim 1 wherein the value of $M_w/M_n$ is at least 2.5.

10. The method of claim 1 wherein the hydroxyl group is from about 5 to about 25% wt of the cross-linkable polymers.

11. The method of claim 1 wherein cross-linkable polymers have a molecular weight of less than or equal to about 5000.

12. The method of claim 1 wherein the cross-linkable polymer comprises as monomer units one or more aromatic compounds.

13. The method of claim 12 wherein the aromatic compounds comprise at least about 20% wt of the total monomer units.

* * * * *